(12) United States Patent
Romo et al.

(10) Patent No.: US 6,516,671 B2
(45) Date of Patent: Feb. 11, 2003

(54) GRAIN GROWTH OF ELECTRICAL INTERCONNECTION FOR MICROELECTROMECHANICAL SYSTEMS (MEMS)

(75) Inventors: Mark G. Romo, Eden Prairie, MN (US); Stanley E. Rud, Jr., Victoria, MN (US); Mark A. Lutz, Minneapolis, MN (US); Fred C. Sittler, Excelsior, MN (US); Adrian C. Toy, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 217 days.

(21) Appl. No.: 09/755,346

(22) Filed: Jan. 5, 2001

(65) Prior Publication Data

US 2003/0010131 A1 Jan. 16, 2003

Related U.S. Application Data

(60) Provisional application No. 60/174,798, filed on Jan. 6, 2000.

(51) Int. Cl.$^7$ ................................................. G01L 9/12
(52) U.S. Cl. ........................................................ 73/718
(58) Field of Search .................. 73/700–756; 361/283.4

(56) References Cited

U.S. PATENT DOCUMENTS

| 3,079,576 A | 2/1963 | Kooiman ........................ 338/4 |
| 3,147,085 A | 9/1964 | Gatti ............................ 23/284 |
| 3,239,827 A | 3/1966 | Werner et al. ............... 340/236 |
| 3,356,963 A | 12/1967 | Buck ............................ 331/65 |
| 3,387,226 A | 6/1968 | Haisma et al. .............. 331/94.5 |
| 3,405,559 A | 10/1968 | Moffatt ........................ 73/398 |
| 3,477,036 A | 11/1969 | Haisma ..................... 331/94.5 |
| 3,589,965 A | 6/1971 | Wallis et al. ................ 156/272 |
| 3,645,137 A | 2/1972 | Hazen ........................ 73/398 |
| 3,696,985 A | 10/1972 | Herring et al. ............. 228/4.29 |
| 3,743,552 A | 7/1973 | Fa ................................ 148/175 |
| 3,744,120 A | 7/1973 | Burgess et al. ................ 29/494 |
| 3,750,476 A | 8/1973 | Brown ......................... 73/398 |
| 3,766,634 A | 10/1973 | Babcock et al. ........... 29/471.9 |
| 3,834,604 A | 9/1974 | Fendley et al. ................ 228/5 |
| 3,854,892 A | 12/1974 | Burgess et al. ............. 29/196.1 |
| 3,858,097 A | 12/1974 | Polye .......................... 317/248 |
| 3,899,878 A | 8/1975 | Compton et al. ........ 60/39.28 T |
| 3,939,559 A | 2/1976 | Fendley et al. ................ 29/628 |
| RE28,798 E | 5/1976 | Herring et al. .............. 228/5.5 |

(List continued on next page.)

OTHER PUBLICATIONS

Science, vol. 286, Nov. 5, 1999, "Patterning Plastic With Plentiful Pillars," p. 1067.

(List continued on next page.)

FOREIGN PATENT DOCUMENTS

| CH | 632 891 G | 11/1982 |
| CS | 153132 | 5/1974 |
| DE | 1 648 764 | 6/1971 |

(List continued on next page.)

*Primary Examiner*—William Oen
*Assistant Examiner*—Andze Allen
(74) *Attorney, Agent, or Firm*—Westman, Champlin & Kelly, P.A.

(57) ABSTRACT

A sensor has an electrical interconnect grown in a cavity between first and second layers that are bonded together. Electrically conductive grain growth material is selectively deposited on at least one of two electrically conductive film interconnect regions that face one another across the cavity. The grain growth material is then grown upon predetermined conditions to form the electrical interconnect between the two interconnect regions. A sensor element deposited in the cavity is electrically coupled between the layers by the interconnect. The grain growth material can be tantalum that is heated after the layers are bonded to grow grains that interconnect the electrically conductive films.

42 Claims, 9 Drawing Sheets

U.S. PATENT DOCUMENTS

| | | | |
|---|---|---|---|
| 3,962,921 A | 6/1976 | Lips | 73/398 |
| 3,994,430 A | 11/1976 | Cusano et al. | 228/122 |
| 4,018,374 A | 4/1977 | Lee et al. | 228/121 |
| 4,064,549 A | 12/1977 | Cretzler | 361/283 |
| 4,078,711 A | 3/1978 | Bell et al. | 228/123 |
| 4,084,438 A | 4/1978 | Lee et al. | 73/706 |
| 4,088,799 A | 5/1978 | Kurtin | 427/38 |
| 4,127,840 A | 11/1978 | House | 338/4 |
| 4,128,006 A | 12/1978 | Grabow | 73/724 |
| 4,158,217 A | 6/1979 | Bell | 361/283 |
| 4,177,496 A | 12/1979 | Bell et al. | 361/283 |
| 4,196,632 A | 4/1980 | Sikorra | 73/718 |
| 4,202,217 A | 5/1980 | Kurtz et al. | 73/727 |
| 4,208,782 A | 6/1980 | Kurtz et al. | 29/580 |
| 4,216,404 A | 8/1980 | Kurtz et al. | 310/338 |
| 4,222,277 A | 9/1980 | Kurtz et al. | 73/721 |
| 4,236,137 A | 11/1980 | Kurtz et al. | 338/4 |
| 4,257,274 A | 3/1981 | Shimada et al. | 73/718 |
| 4,274,125 A | 6/1981 | Vogel | 361/283 |
| 4,276,533 A | 6/1981 | Tominaga et al. | 338/4 |
| 4,278,195 A | 7/1981 | Singh | 228/123 |
| 4,287,501 A | 9/1981 | Tominaga et al. | 338/42 |
| 4,301,492 A | 11/1981 | Paquin et al. | 361/283 |
| 4,330,358 A | 5/1982 | Grabmaier et al. | 156/603 |
| 4,357,200 A | 11/1982 | Grabmaier | 156/603 |
| 4,357,201 A | 11/1982 | Grabmaier et al. | 156/603 |
| 4,359,498 A | 11/1982 | Mallon et al. | 428/156 |
| 4,366,716 A | 1/1983 | Yoshida | 73/724 |
| 4,389,895 A | 6/1983 | Rud, Jr. | 73/724 |
| 4,410,872 A | 10/1983 | Stecher et al. | 338/114 |
| 4,412,203 A | 10/1983 | Kurtz et al. | 338/4 |
| 4,419,142 A | 12/1983 | Matsukawa | 148/1.5 |
| 4,422,125 A | 12/1983 | Antonazzi et al. | 361/283 |
| 4,422,335 A | 12/1983 | Ohnesorge et al. | 73/724 |
| 4,424,713 A | 1/1984 | Kroninger, Jr. et al. | 73/718 |
| 4,426,673 A | 1/1984 | Bell et al. | 361/283 |
| 4,434,665 A | 3/1984 | Adolfsson et al. | 73/724 |
| 4,443,293 A | 4/1984 | Mallon et al. | 156/647 |
| 4,454,765 A | 6/1984 | Lodge | 73/724 |
| 4,456,901 A | 6/1984 | Kurtz et al. | 338/4 |
| 4,479,070 A | 10/1984 | Frische et al. | 310/338 |
| 4,495,820 A | 1/1985 | Shimada et al. | 73/724 |
| 4,497,473 A | 2/1985 | Robyn et al. | 266/44 |
| 4,507,973 A | 4/1985 | Barr et al. | 73/724 |
| 4,517,622 A | 5/1985 | Male | 361/283 |
| 4,525,766 A | 6/1985 | Petersen | 361/283 |
| 4,535,219 A | 8/1985 | Sliwa, Jr. | 219/121 |
| 4,539,061 A | 9/1985 | Sagiv | 156/278 |
| 4,542,436 A | 9/1985 | Carusillo | 361/283 |
| 4,547,801 A | 10/1985 | Haisma et al. | 358/111 |
| 4,558,817 A | 12/1985 | Kiendl | 236/12.12 |
| 4,572,000 A | 2/1986 | Kooiman | 73/718 |
| 4,586,109 A | 4/1986 | Peters et al. | 261/283 |
| 4,591,401 A | 5/1986 | Neidig et al. | 156/89 |
| 4,598,996 A | 7/1986 | Taniuchi | 356/43 |
| 4,609,966 A | 9/1986 | Kuisma | 361/283 |
| 4,625,559 A | 12/1986 | Carter et al. | 73/706 |
| 4,649,070 A | 3/1987 | Kondo et al. | 428/209 |
| 4,689,999 A | 9/1987 | Shkedi | 73/708 |
| 4,703,658 A | 11/1987 | Mrozack, Jr. et al. | 73/724 |
| 4,716,492 A | 12/1987 | Charboneau et al. | 73/718 |
| 4,753,109 A | 6/1988 | Zabler | 73/115 |
| 4,754,365 A | 6/1988 | Kazahaya | 361/283 |
| 4,764,747 A | 8/1988 | Kurtz et al. | 338/2 |
| 4,769,882 A | 9/1988 | Rosen et al. | 29/25.35 |
| 4,773,972 A | 9/1988 | Mikkor | 204/16 |
| 4,774,196 A | 9/1988 | Blanchard | 437/24 |
| 4,780,572 A | 10/1988 | Kondo et al. | 174/52 |
| 4,800,758 A | 1/1989 | Knecht et al. | 73/727 |
| 4,806,783 A | 2/1989 | Anderson | 307/118 |
| 4,810,318 A | 3/1989 | Haisma et al. | 156/153 |
| 4,849,374 A | 7/1989 | Chen et al. | 437/209 |
| 4,852,408 A | 8/1989 | Sanders | 73/718 |
| 4,857,130 A | 8/1989 | Curtis | 156/292 |
| 4,875,368 A | 10/1989 | Delatorre | 73/151 |
| 4,879,903 A | 11/1989 | Ramsey et al. | 73/431 |
| 4,883,215 A | 11/1989 | Goesele et al. | 228/116 |
| 4,901,197 A | 2/1990 | Albarda et al. | 361/283 |
| 4,908,921 A | 3/1990 | Chen et al. | 29/25.41 |
| 4,929,893 A | 5/1990 | Sato et al. | 324/158 |
| 4,954,925 A | 9/1990 | Bullis et al. | 361/283 |
| 4,971,925 A | 11/1990 | Alexander et al. | 437/62 |
| 4,972,717 A | 11/1990 | Southworth et al. | 73/724 |
| 4,980,243 A | 12/1990 | Malikowski et al. | 428/621 |
| 4,983,251 A | 1/1991 | Haisma et al. | 156/630 |
| 4,994,781 A | 2/1991 | Sahagen | 338/47 |
| 5,001,934 A | 3/1991 | Tuckey | 73/721 |
| 5,005,421 A | 4/1991 | Hegner et al. | 73/72 |
| 5,009,689 A | 4/1991 | Haisma et al. | 65/33 |
| 5,013,380 A | 5/1991 | Aoshima | 156/250 |
| 5,024,098 A | 6/1991 | Petitjean et al. | 73/729 |
| 5,028,558 A | 7/1991 | Haisma et al. | 437/62 |
| 5,044,202 A | 9/1991 | Southworth et al. | 73/724 |
| 5,050,034 A | 9/1991 | Hegner et al. | 361/283 |
| 5,050,035 A | 9/1991 | Hegner et al. | 361/283 |
| 5,068,712 A | 11/1991 | Murakami et al. | 357/72 |
| 5,084,123 A | 1/1992 | Curtis | 156/292 |
| 5,087,124 A | 2/1992 | Smith et al. | 356/358 |
| 5,088,329 A | 2/1992 | Sahagen | 73/727 |
| 5,094,109 A | 3/1992 | Dean et al. | 73/718 |
| 5,095,741 A | 3/1992 | Bartig et al. | 73/115 |
| 5,113,868 A | 5/1992 | Wise et al. | 128/675 |
| 5,123,849 A | 6/1992 | Deak et al. | 439/66 |
| 5,133,215 A | 7/1992 | Lane, III et al. | 73/756 |
| 5,155,061 A | 10/1992 | O'Conner et al. | 437/86 |
| 5,157,972 A | 10/1992 | Broden et al. | 73/718 |
| 5,174,926 A | 12/1992 | Sahagen | 252/521 |
| 5,178,015 A | 1/1993 | Loeppert et al. | 73/718 |
| 5,189,591 A | 2/1993 | Bernot | 361/283 |
| 5,189,916 A | 3/1993 | Mizumoto et al. | 73/724 |
| 5,197,892 A | 3/1993 | Yoshizawa et al. | 439/91 |
| 5,201,228 A | 4/1993 | Kojima et al. | 73/724 |
| 5,201,977 A | 4/1993 | Aoshima | 156/153 |
| 5,214,563 A | 5/1993 | Estes | 361/386 |
| 5,214,961 A | 6/1993 | Kojima et al. | 73/715 |
| 5,227,068 A | 7/1993 | Runyon | 210/610 |
| 5,228,862 A | 7/1993 | Baumberger et al. | 439/66 |
| 5,231,301 A | 7/1993 | Peterson et al. | 257/419 |
| 5,236,118 A | 8/1993 | Bower et al. | 228/193 |
| 5,242,863 A | 9/1993 | Xiang-Zheng et al. | 437/228 |
| 5,242,864 A | 9/1993 | Fassberg et al. | 437/228 |
| 5,257,542 A | 11/1993 | Voss | 73/724 |
| 5,261,999 A | 11/1993 | Pinker et al. | 156/630 |
| 5,271,277 A | 12/1993 | Pandorf | 73/724 |
| 5,287,746 A | 2/1994 | Broden | 73/706 |
| 5,294,760 A | 3/1994 | Bower et al. | 200/83 |
| 5,314,107 A | 5/1994 | d'Aragona et al. | 228/116 |
| 5,315,481 A | 5/1994 | Smolley | 361/707 |
| 5,319,324 A | 6/1994 | Satoh et al. | 331/158 |
| 5,326,726 A | 7/1994 | Tsang et al. | 437/228 |
| 5,326,729 A | 7/1994 | Tsang et al. | 437/228 |
| 5,332,469 A | 7/1994 | Mastrangelo | 156/643 |
| 5,349,492 A | 9/1994 | Kimura et al. | 361/283.4 |
| 5,381,300 A | 1/1995 | Thomas et al. | 361/280 |
| 5,424,650 A | 6/1995 | Frick | 324/688 |
| 5,437,189 A | 8/1995 | Brown et al. | 73/721 |
| 5,440,075 A | 8/1995 | Kawakita et al. | 174/265 |
| 5,466,630 A | 11/1995 | Lur | 437/62 |
| 5,470,797 A | 11/1995 | Mastrangelo | 437/225 |
| 5,471,884 A | 12/1995 | Czarnocki et al. | 73/720 |
| 5,478,972 A | 12/1995 | Mizutani et al. | 174/250 |

| | | | | | | |
|---|---|---|---|---|---|---|
| 5,479,827 A | 1/1996 | Kimura et al. ............... 73/718 | JP | 3-239940 | 10/1991 | |
| 5,481,795 A | 1/1996 | Hatakeyama et al. ......... 29/852 | JP | 2852593 | 3/1993 | |
| 5,483,834 A | 1/1996 | Frick ........................... 73/724 | JP | 5-107254 | 4/1993 | |
| 5,528,452 A | 6/1996 | Ko ........................... 361/283.4 | JP | 5-231975 | 9/1993 | |
| 5,532,187 A | 7/1996 | Schreiber-Prillwitz et al. ........................... 437/182 | JP | 6-21741 | 1/1994 | |
| | | | JP | 6-265428 | 9/1994 | |
| 5,554,809 A | 9/1996 | Tobita et al. ................. 73/700 | JP | 6-300650 | 10/1994 | |
| 5,606,513 A | 2/1997 | Louwagie et al. .......... 364/510 | JP | 283761 | 10/1998 | |
| 5,612,497 A | 3/1997 | Walter et al. ................. 73/756 | JP | 11006780 | 12/1999 | |
| 5,637,802 A | 6/1997 | Frick et al. ................... 73/724 | SU | 463643 | 10/1975 | |
| 5,731,522 A | 3/1998 | Sittler ......................... 73/708 | SU | 736216 | 5/1980 | |
| 6,106,476 A | 8/2000 | Corl et al. .................. 600/486 | SU | 1398825 A1 | 5/1988 | |
| 6,126,889 A | 10/2000 | Scott et al. ................. 264/632 | SU | 1597627 A1 | 10/1990 | |
| 6,131,462 A | 10/2000 | EerNisse et al. ............. 73/702 | SU | 1629763 A1 | 2/1991 | |
| 6,311,563 B1 | 11/2001 | Ishikura ...................... 73/724 | WO | WO 83/00385 | 2/1983 | |
| | | | WO | WO 85/02677 | 6/1985 | |
| | FOREIGN PATENT DOCUMENTS | | WO | WO 87/07947 | 12/1987 | |
| | | | WO | WO 87/07948 | 12/1987 | |
| DE | 2 021 479 | 11/1971 | WO | WO 93/22644 | 11/1993 | |
| DE | 2 221 062 | 11/1972 | WO | WO 96/16418 | 5/1996 | |
| DE | 24 59 612 | 7/1975 | WO | WO 96/27123 | 9/1996 | |
| DE | 34 04 262 A1 | 9/1984 | WO | WO/99/46570 A1 | 3/1999 | |
| DE | 40 11 901 A1 | 10/1991 | WO | WO 99/46570 | 9/1999 | |
| DE | 42 44 450 A1 | 12/1992 | | | | |
| EP | 0 024 945 A2 | 9/1980 | | | | |
| EP | 0 136 050 A1 | 8/1984 | | | | |
| EP | 0 161 740 A2 | 2/1985 | | | | |
| EP | 0 166 218 A2 | 5/1985 | | | | |
| EP | 0 182 032 A2 | 9/1985 | | | | |
| EP | 0 190 508 A2 | 12/1985 | | | | |
| EP | 0 207 272 A2 | 5/1986 | | | | |
| EP | 0 213 299 A2 | 6/1986 | | | | |
| EP | 0 210 843 A2 | 7/1986 | | | | |
| EP | 0 256 150 A1 | 8/1986 | | | | |
| EP | 0 351 701 B1 | 7/1989 | | | | |
| EP | 0 355 340 A1 | 2/1990 | | | | |
| EP | 0 383 391 A1 | 8/1990 | | | | |
| EP | 0 430 676 A2 | 11/1990 | | | | |
| EP | 0 410 679 A1 | 1/1991 | | | | |
| EP | 0 413 547 A2 | 2/1991 | | | | |
| EP | 0 444 942 A1 | 9/1991 | | | | |
| EP | 0 444 943 A | 9/1991 | | | | |
| EP | 0 451 993 A2 | 10/1991 | | | | |
| EP | 0 456 060 A1 | 11/1991 | | | | |
| EP | 0 460 763 A2 | 11/1991 | | | | |
| EP | 0 473 109 A2 | 3/1992 | | | | |
| EP | 0 476 897 A2 | 3/1992 | | | | |
| EP | 0 526 290 A1 | 2/1993 | | | | |
| EP | 0 547 684 A2 | 6/1993 | | | | |
| EP | 0 556 009 A2 | 8/1993 | | | | |
| EP | 0 579 298 A1 | 1/1994 | | | | |
| EP | 0 928 959 A2 | 7/1999 | | | | |
| FR | 1 568 487 | 5/1969 | | | | |
| FR | 2 246 506 | 5/1975 | | | | |
| FR | 2 455 733 | 11/1980 | | | | |
| GB | 1 069 435 | 11/1963 | | | | |
| GB | 1 305 885 | 4/1971 | | | | |
| GB | 2034478 | 6/1980 | | | | |
| GB | 2 071 853 A | 3/1981 | | | | |
| GB | 2 168 160 A | 11/1985 | | | | |
| JP | 49-38911 | 4/1974 | | | | |
| JP | 60-97676 | 5/1985 | | | | |
| JP | 62-70271 | 3/1987 | | | | |
| JP | 60-195546 | 7/1987 | | | | |
| JP | 62-104131 | 7/1987 | | | | |
| JP | 62-167426 | 7/1987 | | | | |
| JP | 62-259475 | 11/1987 | | | | |
| JP | 63-285195 | 11/1988 | | | | |
| JP | 63-292032 | 11/1988 | | | | |
| JP | 91-311556 | 4/1990 | | | | |
| JP | 2-148768 | 6/1990 | | | | |
| JP | 2-249936 | 10/1990 | | | | |

OTHER PUBLICATIONS

PWS–Kent Publishing Company, "Physical Metallurgy Principles," Third Edition, pp. 251–269.

A Wiley–Interscience Publication, "Introduction to Ceramics," Second Edition, pp. 448–461.

"Silicon–on–Sapphire Pressure Sensor", by C. Qinggui et al., *Transducers*, (1987), 4 pgs.

"Spectroscopic Study of the Surfaces of Glass Joined by Optical Contact", by V.M. Zolotarev et al., *Sov. J. Opt. Technol.*, (Jun. 1977), pp. 379–380.

"Effect of Scale and Time Factors on the Mechanical Strength of an Optical Contact", by S.S. Kachkin et al., *Sov. J. Opt. Technol.*, vol. 56, No. 2, (Feb. 1989), pp. 110–112.

"High Pressure Sensors", *Instrument Engineers Handbook, Vol. 1, Process Measurement*, B. Liptak, Editor, pp. 244–245.

"Silicon on Sapphire: The Key Technology for High–Temperature Piezoresistive Pressure Transducers", by H.W. Keller et al., *Transducers*, (1987), 4 pgs.

"Optical–Contact Bonding Strength of Glass Components", by S. S. Kachkin et al., *Sov. J. Opt. Technol.*, vol. 47, No. 3, (Mar. 1980), pp. 159–161.

"A Cold High–Vacuum Seal Without Gaskets", by L. Macebo, University of California Lawrence Radiation Laboratory, (Sep. 1, 1962), pp. 1–11.

"Diffusionsschweissen Optischer Bauelemente Aus Quarzglas", by K. Veb et al., *Schweisstechnik, Berlin*, (1983), pp. 262–264.

"Pressure and Temperature Measurements with Saw Sensors", by D. Hauden et al., *36th Annual Frequency Control Symposium*, (1982), pp. 284–289.

"Transient Response of Capacitive Pressure Sensors", by P. Pons et al., *Sensors and Actuators*, (1992) pp. 616–621.

"Analysis and Design of a Four–Terminal Silicon Pressure Sensor at the Centre of a Diaphragm", by M. Bao et al, *Sensors and Actuators*, (1987), pp. 49–56.

"A Stress and Temperature Compensated Orientation and Propagation Direction for Surface Acoustic Wave Devices", by B. Sinha, *IEEE Transactions on Ultrasonics, Ferroelectrics, and Frequency Control*, vol. UFFC–34, No. 1, (Jan. 1987), pp. 64–74.

"Nonlinear Analyses on CMOS Integrated Silicon Pressure Sensors", by K. Suzuki et al., *IEEE*, (1985), pp. 137–140.

"New Techniques for Fusion Bonding and Replication for Large Glass Reflectors", by J.R. Angel, Steward Observatory, University of Arizona, pp. 52–56.

"Pressure Sensitivity in Anisotropically Etched Thin–Diaphram Pressure Sensors", by S. Clark et al, *IEEE Transactions on Electron Devices*, vol. Ed–26, No. 12, (Dec. 1979), pp. 1887–1896.

"Study of the Stressed State of a Sintered Quartz Monoblock", by Y. Lisitsyn et al., Plenum Publishing Corporation, (1986), pp. 643–645.

"Direct Bonding in Patent Literature", by J. Haisma, *Philips J. Res.*, (1995), pp. 165–170.

"Special Issue on Direct Bonding", by J. Haisma et al., *Philips Journal of Research*, vol. 49, No. 1/2, (1995), pp. 1–182.

"Diversity and Feasibility of Direct Bonding: A Survey of a Dedicated Optical Technology", by J. Haisma et al., *Applied Optics*, vol. 33, No. 7, (Mar. 1994), pp. 1154–1169.

"Structure and Morphology of the Reaction Fronts During the Formation of $MgAl_2O_4$ Thin Films by Solid State Reaction Between R–cut Sapphire Substrates and MgO Films", by D. Hesse et al., *Interface Science*, (1994) pp. 221–237.

"Development of a High Temperature Capacitive Pressure Transducer", by R. L. Egger, *NASA CR–135282* (Oct. 1977)., pp. 1–114.

"High Temperature Pressure Transducer", *Techlink Industry*, Techlink No. 2359, (1978), 2 pgs.

"Quartz Capsule Pressure Transducer for the Automotive Industry", by D.Y. Lee et al., *SAE Technical Paper Series Society of Automotive Engineers, Inc.*, (Feb. 1981), 6 pgs.

"Low–Cost High–Sensitivity Integrated Pressure and Temperature Sensor", by P. Pons et al., *Sensors and Actuators*, (1994), pp. 398–401.

"A New Type of High Performance Device for VLSI Digital System", by X. Xiao–Li et al., *Solid State Devices*, (1988), pp. 579–582.

"Wafer Bonding For SOI", by W.P. Maszara et al., *Mat. Res. Soc. Symp. Proc.*, vol. 107, (1988), 2 pgs.

"Silicon Fusion Bonding For Pressure Sensors", by K. Peterson et al., *IEEE*, (1988), pp. 146–147.

"Silicon–To–Silicon Direct Bonding Method", by M. Shimbo et al., *Journal of Applied Physics*, vol. 60, No. 8, (Oct. 1986), pp. 2987–2989.

"A Model for the Silicon Wafer Bonding Process", by R. Stengl et al., *Japanese Journal of Applied Physics*, vol. 28, No. 10, (Oct. 1989), pp. 1735 & 1741.

"A Small and Stable Continuous Gas Laser", by H.G. Van Bueren et al., *Physics Letters* vol. 2, No. 7, (Nov. 1962), 2 pgs.

"Direct Bonding of Ceramics and Metals by Means of a Surface Activation Method in Ultrahigh Vacuum", by T. Suga et al., *Proceedings of the MRS International Meeting on Advanced Materials*, vol. 8, (Jun. 1988), pp. 257–263.

"Silicon–On–Insulator Wafer Bonding–Wafer Thinning Technological Evaluations", by J. Haisma et al., *Japanese Journal of Applied Physics*, vol. 28, No. 8, (Aug. 1989), 4 pgs.

"Closure and Repropagation of Healed Cracks in Silicate Glass", by T. Michalske et al., *Journal of the American Ceramic Society*, vol. 68, No. 11, (Nov. 1985), 3 pgs.

"Use of Strain Gauges with a Silicon–On–Sapphire Structure for Thermophysical Experiments", by V.F. Kukarin et al., Plenum Publishing Corporation, (1986) pp. 1085–1087.

"Metrological Characteristics for Saphir–22D Pressure Sensors", by A.M. Evtyushenkov et al., Plenum Publishing Corporation, (1989), pp. 147–150.

"Low–Temperature Characteristics of the Transducer", *Rev. Sci. Instrum.*, vol. 56, No. 6, (Jun. 1985), pp. 1237–1238.

"The Joining of Ceramics", by A.S. Bahrani, *Int. J. for the Joining of Materials*, vol. 4, No. 1 (1992), pp. 13–19.

"Chemical Free Room Temperature Wafer to Wafer Direct Bonding", by S. Farrens et al., *J. Electrochem. Soc.*, vol. 142, No. 11, (Nov. 1985), pp. 3949–3955.

"Morphological Evolution of Pore Channels in Alumina", by J. Rodel et al., *Ceramic Transactions—Sintering of Advanced Ceramics*, vol. 7, (May 1988), pp. 243–257.

"Le Poli Optique, Element De La Construction Des Tubes A Vide(')", by P. Danzin et al., *Annales De Radioelectricite*, (Jan. 1948), pp. 281–289.

"Strength of Glass Ceramic S0115M and its Joints Based on Optical Contact", by A.I. Busel et al, Plenum Publishing Corporation, (1983), p. 378.

"Bubble–Free Silicon Wafer Bonding in a Non–Cleanroom Environment", by R. Stengl et al., Department of Mechanical Engineering and Materials Science, Duke University, (1988) p. L2364.

"Boundary Migration of Single Crystal in Polycrystalline Alumina", by M. Kinoshita, *Journal of the Ceramic Society of Japan*, vol. 82, No. 945, (1974), pp. 295–296.

"Diffusion Bonding of Ceramics", by C. Scott et al., *American Ceramic Society Bulletin*, (Aug. 1985) pp. 1129–1131.

"Creep of Sensor's Elastic Elements: Metals versus Non–metals", K. Bethe, D. Baumgarten and J. Frank, *NOVA Sensor—Silicon Sensors and Microstructure*, 1990, pp. 844–849.

"High–Temperature Healing of Lithographically Introduced Cracks in Sapphire", J. Rödel and A.M. Glaeser, *J. Am. Ceram. Soc.*, vol. 73, No. 3, Mar. 1990, pp. 592–601.

"Fabrication of an Implantable Capacitive Type Pressure Sensor", S. Shoji, T. Nisase, M. Esashi and T. Matsuo, *Transducers '87*, 1987.

"Small sensitive pressure transducer for use at low temperatures", W. Griffioen and G. Frossati, *Rev. Sci. Instrum.*, vol. 56, No. 6, Jun. 1985, pp. 1236–1238.

"Interface charge control of directly bonded silicon structures", S. Bengtsson and O. Engström, *J. Appl. Phys.*, vol. 66, No. 3, Aug. 1, 1989, pp. 1231–1239.

"Wafer bonding for silicon–on–insulator technologies", J.B. Lasky, *Appl. Phys Lett.*, vol. 48, No. 1, Jan. 1, 1986, pp. 78–80.

"Production of Controlled–Morphology Pore Arrays: Implications and Opportunities", J. Rödel and A.M. Glaeser, *J. Am. Ceram. Soc.*, vol. 70, No. 8, Aug. 1987, pp. C–172–C–175.

"Low–Temperature Preparation of Silicon/Silicon Interface by the Silicon–to–Silicon Direct Bonding Method", by S. Bengtsson et al., *J. Electrochem. Soc.*, vol. 137, No. 7, (Jul. 1990), pp. 2297–2303.

"Phase Formation Study in α–Al$_2$O$_3$ Implanted With Niobium Ions", by L. Romana, P. Thevenard, B. Canut, G. Massouras and R. Brenier, *Nuclear Instruments and Methods in Physics Research B46,* published by Elsevier Science Publishers B.V. (North–Holland), pp. 94–97 (1990).

"Surface electrical properties of Ni–implanted sapphire", by L. Shipu, F. Donghui, X. Ning, S. Zhenya and C. Xiaoming, *Processing of Advanced Materials,* published by Chapman & Hall, pp. 77–80 (1991).

"Silicon Microcavities Fabricated with a New Technique", L. Tenerz and B. Hök, *Electronic Letters,* vol. 22, No. 11, May 22, 1986, pp. 615–616.

"A Balanced Resonant Pressure Sensor", E. Stemme and G. Stemme, *Sensors and Actuators,* A21–A23, 1990, pp. 336–341.

"Silicon Sensors and Microstructure", J. Brysek, K. Peterson, J. Mallon, Jr., L. Christel, F. Pourahdmadi, *NOVA Sensor,* Jun. 1990, pp. 5.4–5.8, 8.21–8.23, 9.9–9.10, 9.13–9.15.

"Why Nanoparticles Are So Big", C. Crabb, C. Armesto, T. Kamiya, *Chemical Engineering,* Apr. 1999, pp. 37–41.

"Patterning Plastic With Plentiful Pillars", *Science,* vol. 286, p. 1067, Nov. 5, 1999.

*Physical Metallurgy Principles,* pp. 251–269, Oct. 26, 1993.

"Grain Growth, Sintering, and Vitrification", *Introduction to Ceramics,* pp. 448–461, Jan. 9, 1990.

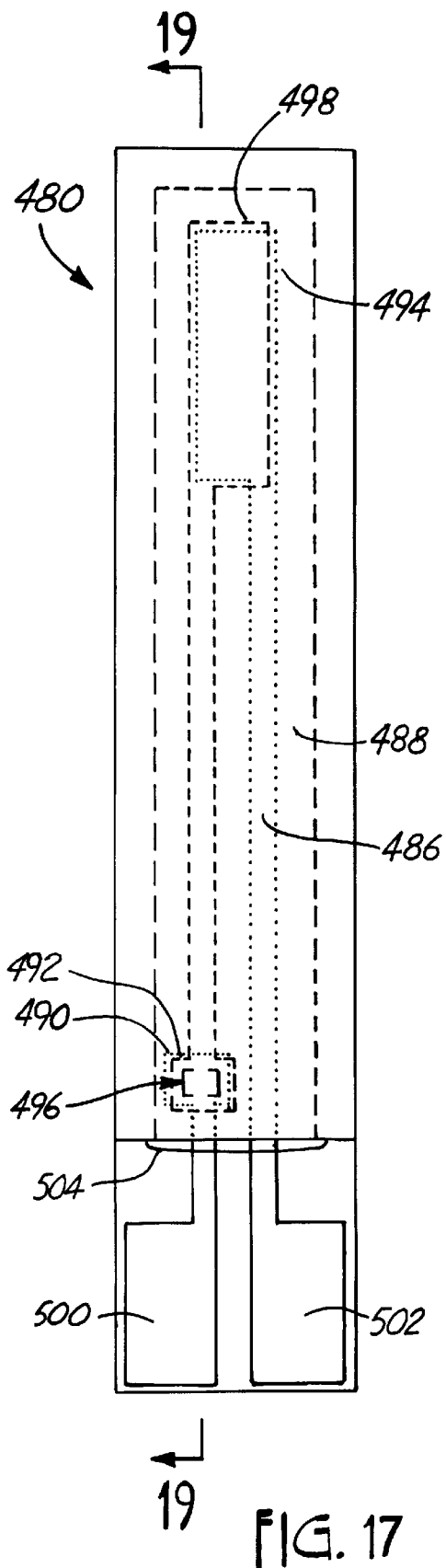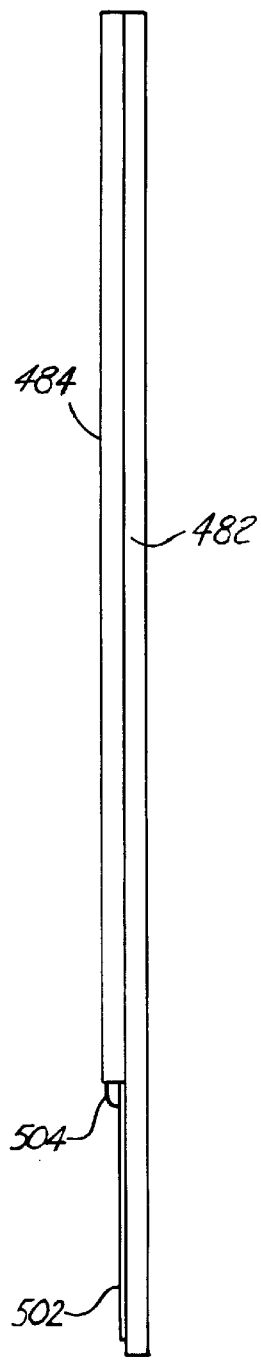
FIG. 17
FIG. 18

GRAIN GROWTH OF ELECTRICAL INTERCONNECTION FOR MICROELECTROMECHANICAL SYSTEMS (MEMS)

CROSS REFERENCE TO RELATED APPLICATION

This application claims the benefit of priority from provisional application Serial No. 60/174,798, filed Jan. 6, 2000 and entitled "GRAIN GROWTH OF ELECTRICAL INTERCONNECTION FOR CONTACT BONDED PRESSURE SENSOR".

BACKGROUND OF THE INVENTION

The present invention relates to microelectromechanical systems. More particularly, the present invention relates to providing electrical connections in such systems. Microelectromechanical systems (MEMS) are small devices which provide certain electrical and mechanical functions and are typically batch fabricated. MEMS have found wide spread use in many electrical devices. Example MEMS include acceleration, pressure, flow, displacement, proximity, sensors and valves, pumps, and optical component actuators. One specific use for MEMS transducers is in pressure sensing applications.

In aviation or industrial fluid sensor applications, fluids (media) can corrode sensor elements, metal films and connections that are used in manufacturing the sensors. Corrosive process fluids can include gasses in an aerospace or stationary turbine engine, acids, caustics, oils, petrochemicals, foodstuffs and the like.

Sensor elements are preferably placed between layers of a sensor body and interconnects are also preferably between the layers and sealed so that corrosive process fluids do not come in contact with the sensor elements and interconnects.

In miniature devices that are made using MEMS (microelectromechanical systems) techniques, it is difficult to provide electrical interconnects between layers of the sensor body. This is true for sensors made with MEMS techniques. With MEMS bonding methods, the flat layers of the sensor body need to come together with precise alignment and extremely small gaps, without irregularities or protrusions between the layers. Interconnects that mechanically protrude will contact and hold the flat surface apart during bonding. Defective bonds or leaks can result.

Mechanical contact between interconnects needs to be avoided during bonding of the layers. Mechanical contact of the interconnects, is needed, however, in order to complete an electrical circuit at the interconnect. The two MEMS process needs conflict with one another.

SUMMARY OF THE INVENTION

An isolated connection is formed by growing interconnects from the grain growth of a electrically conductive grain growth material inside a MEMS device after the device is bonded together. The material used for grain growth of electrical contacts is deposited inside a cavity formed between first and second layers of the device. In one aspect, the material deposit is relatively flat at the time of assembly and does not interfere with bonding between peripheral edges of the cavity. After assembly of the first and second layers, the deposit is heated and grows an electrical interconnect forms through grain growth of conductive films or leads that are selectively deposited inside the cavity.

BRIEF DESCRIPTION OF THE DRAWINGS

FIG. 17 shows a top view of an embodiment of a capacitive pressure sensor;

FIG. 18 shows a side view of the capacitive pressure sensor of FIG. 17;

DETAILED DESCRIPTION OF THE PREFERRED EMBODIMENTS

Figure 1:
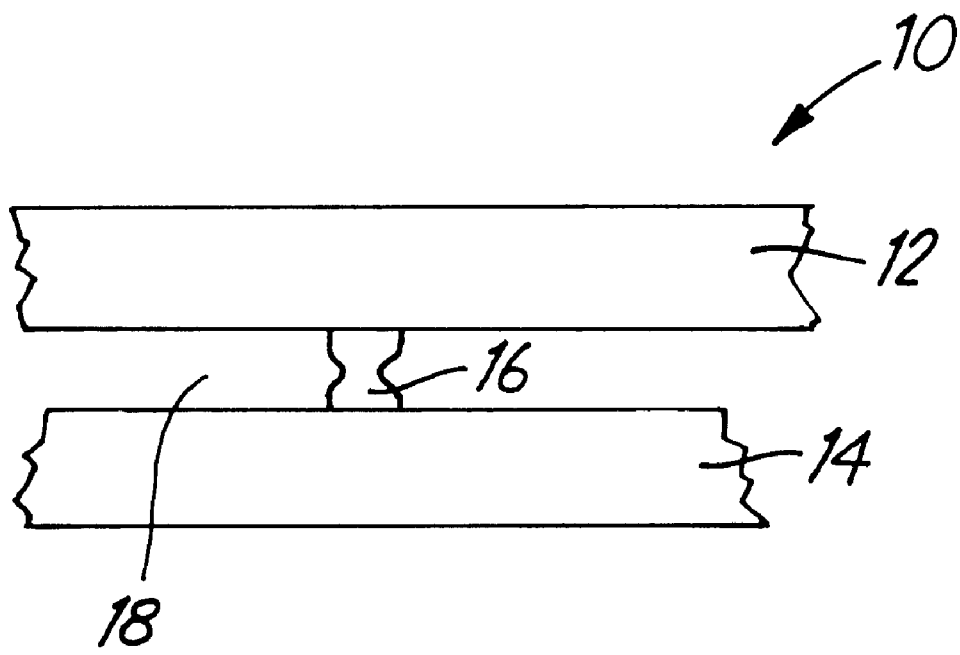
FIG. 1 is a cross-sectional diagram of a MEMS device in accordance with the invention.

FIG. 1 is a simplified cross-sectional view of a portion of MEMS device 10 in accordance with the present invention. MEMS device 10 includes an upper layer 12 and a lower layer 14. Layers 12 and 14 are electrically coupled together through electrical connection 16 in accordance with the present invention. As explained in more detail herein, electrical connection 16 is formed through a grain growth process to electrically couple layers 12 and 14 together. In general, the present invention can be used to provide a connection between two planar substrates where the connection extends in a direction which is perpendicular (i.e., in a third dimension to the substrates). For example, the electrical connection 16 can bridge a gap 18 between the two layers 12 and 14. This technique can be used in all types of MEMS devices, for example pressure, acceleration, flow sensors or others. Much of the following description is specifically directed to a pressure sensor which utilizes a connector such as connection 16 shown in FIG. 1. However, the invention is not limited to this specific application. Such pressure sensors have many applications such as monitoring of industrial processes or other pressures in other installations.

Figure 2:
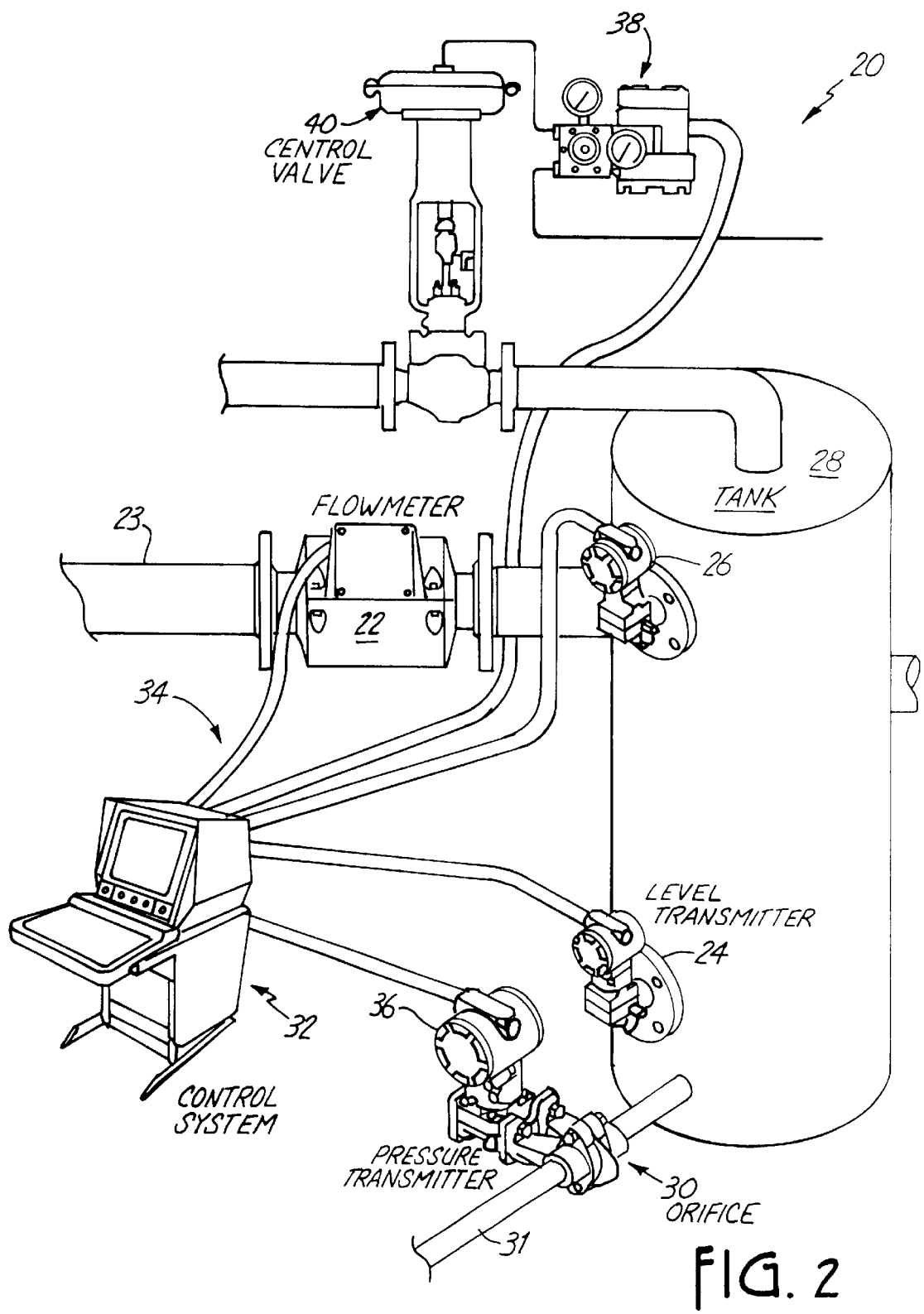
FIG. 2 shows a typical industrial environment for a loop powered industrial transmitter.

In FIG. 2, a typical environment for an industrial pressure sensor is illustrated at 20. In FIG. 1, process variable transmitters such as flow meter 22 in process fluid line 23, transmitters 24, 26, 36 near tank 28 and integral orifice flow meter 30 in process line 31 are shown electrically connected to control system 32. Control system 32 controls a current to pressure converter 38 which controls control valve 40. Process variable transmitters can be configured to monitor one or more process variables associated with fluids in a process plant such as slurries, liquids, vapors and gasses in chemical, pulp, petroleum, gas, pharmaceutical, food and other fluid processing plants. The monitored process variables can be pressure, temperature, flow, level, pH, conductivity, turbidity, density, concentration, chemical composition or other properties of fluids. A process variable transmitter includes one or more sensors that can be either internal to the transmitter or external to the transmitter, depending on the installation needs of the process plant.

Process variable transmitters generate one or more transmitter outputs that represent the sensed process variable. Transmitter outputs are configured for transmission over long distances to a controller or indicator via communication busses 34. In typical fluid processing plants, a communication buss 34 can be a 4–20 mA current loop that powers the transmitter, or a fieldbus connection, a HART protocol communication or a fiber optic connection to a controller, a control system or a readout. In transmitters powered by a 2 wire loop, power must be kept low to provide intrinsic safety in explosive atmospheres.

Figure 3:
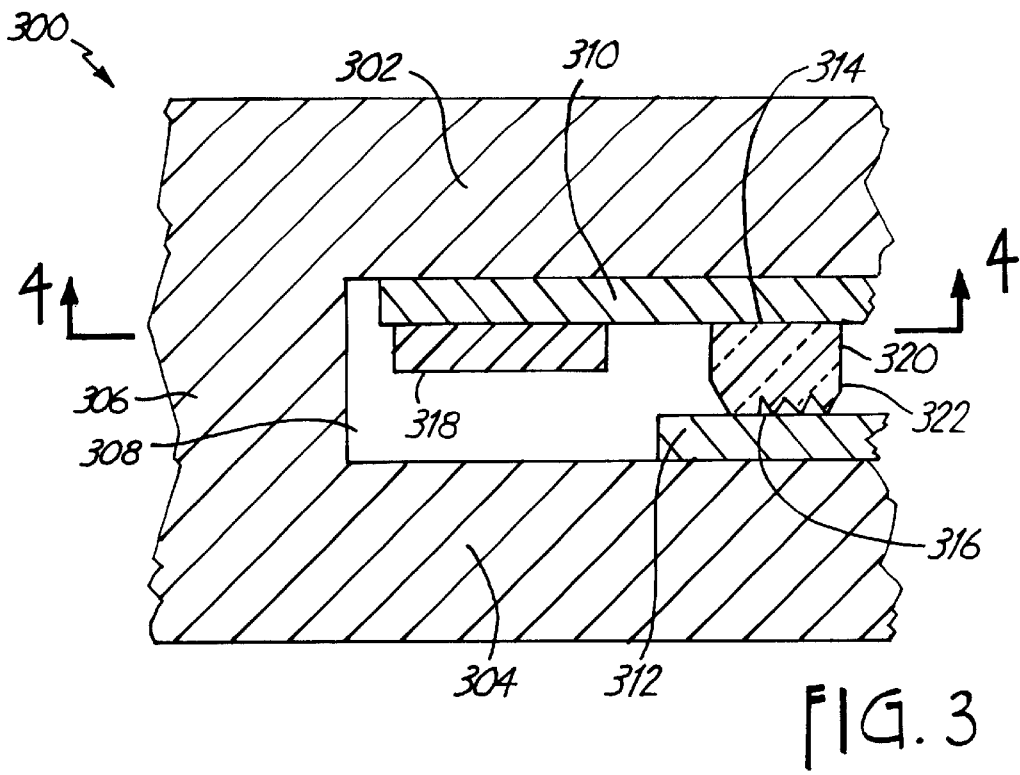
FIG. 3 shows a partial cross-sectional front view of an embodiment of a sensor with a grain growth interconnect.
Figure 4:
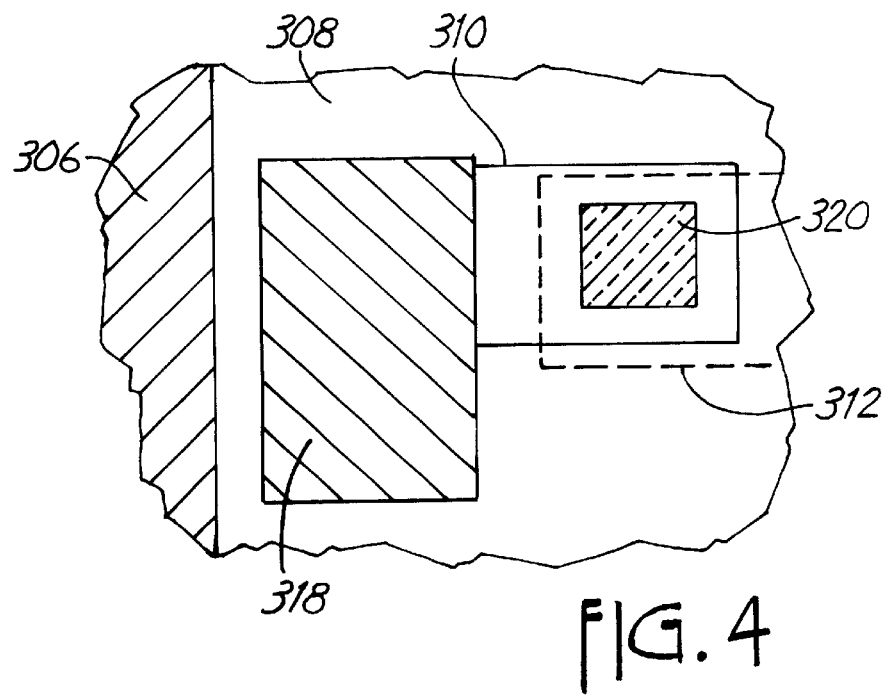
FIG. 4 shows a sectional top view of the sensor shown in FIG. 3 along line 4—4 in FIG. 3.

In FIGS. 3–4, a sensor 300 is illustrated. Sensor 300 is a microminiature or MEMS sensor manufactured using techniques typically adapted from semiconductor manufacturing such as masking, etching, plating and bonding. Sensor 300 comprises a first layer 302 bonded at bond 306 to a second layer 304. Layers 302 and 304 are formed of electrically insulating materials such as sapphire, spinel, various ceramics, glasses, nanoparticle fabricated materials, insulated silicon and other materials that have low hysteresis and are compatible with the desired process fluid or isolator fluid which the outside of sensor 300 will contact. A cavity 308 formed between the layers 302, 304 is isolated from the process fluid or isolator fluid that is outside the sensor. Sensor 300 can be any type of sensor. In one specific example, sensor 300 comprises a pressure sensor which includes capacitive plates formed by electrically conductive layers.

A first electrically conductive film 310 is selectively deposited on the first layer 302 in the cavity 308 to define one or more electrical conductor traces for the sensor 300. A second electrically conductive film 312 is deposited on the second layer 304 in the cavity 308 to define one or more further electrical conductor traces for the sensor 300. The first electrically conducting film 310 includes at least a first interconnect region 314. The second electrically conducting film 312 includes at least a second interconnect region 316. The first and second interconnect regions 314, 316 face one another across the cavity 308.

The sensor 300 includes a sensor element 318 deposited in the cavity 308 and electrically coupled to the first electrically conductive film 310. Sensor element 318 can take a variety of forms depending on the type of fluid parameter being sensed and may in some cases be formed of the same material as the first electrically conductive film 310, or be an integral part of the first electrically conductive film 310. Sensor element 318 can also include portions that are deposited on the second layer 304 or the second electrically conductive film 312.

In sensor 300, an electrically conductive grain growth material 320 is selectively deposited on one or both of the interconnect regions 314, 316. The grain growth material 320 is deposited in a thin enough layer or layers so that it does not make mechanical contact across the interconnect gap. The layers 302, 304 can thus be bonded together at 306 without mechanical interference from the grain growth material 320. After the bond 306 is complete, the grain growth material 320 is grown upon predetermined conditions to form an electrical interconnect 322 between the first and second interconnect regions 314, 316. The grain growth material is typically tantalum, or an alloy of tantalum, that grows metallic grains when it is heated to a predetermined high temperature after the bonding step. The growth of the metallic grains bridges across the interconnect gap and forms the electrical interconnect 322 as depicted in FIG. 3.

FIGS. 5–8 illustrate alternative shapes for the layers 302, 304 which can be used to space the layers apart and form the desired cavity 308 in the sensor 300.

Figure 5:
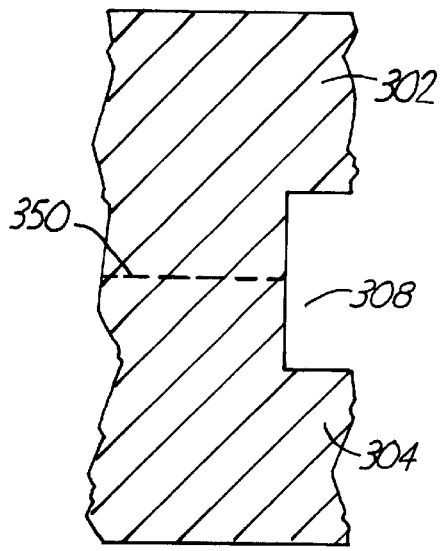
FIG. 5 shows cross-sectional view of an embodiment of a bond between two recessed layers.

In FIG. 5, the first layer 302 and the second layer 304 each include a recess that together form the cavity 308. Layer 302 and 304 are bonded together along a central surface 350 The arrangement shown in FIG. 5 has the advantage that layers 302 and 304 can be constructed identically for some applications.

Figure 6:
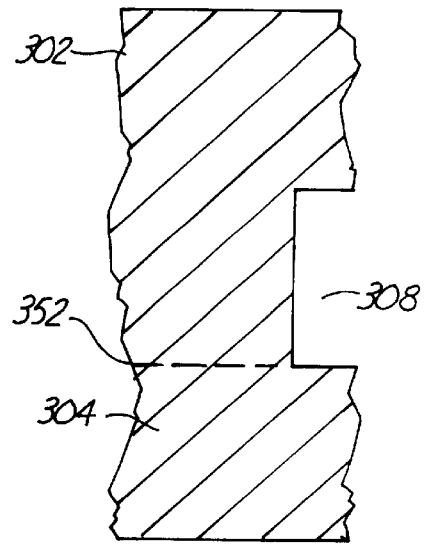
FIG. 6 shows a cross-sectional view of an embodiment of a bond between a recessed layer and a flat layer.

In FIG. 6, the first layer 302 includes a recess, but the second layer 304 is substantially a flat plate. In FIG. 6, layers 302 and 304 are bonded together along a surface 352 that is aligned with one side of the cavity. The arrangement shown in FIG. 6 has the advantage that only one of the two layers requires a recess and that recess forms the cavity 308, which reduces processing steps.

Figure 7:
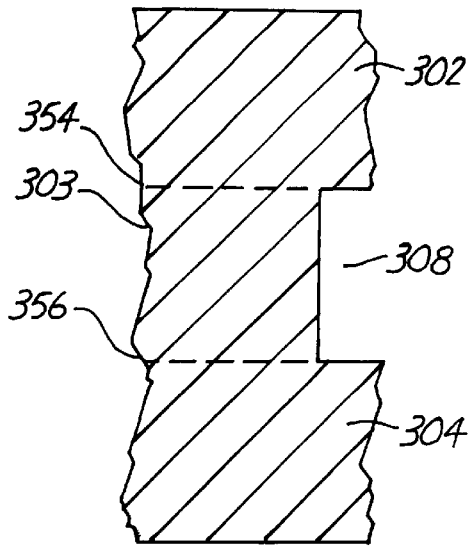
FIG. 7 shows a cross-sectional view of an embodiment of a bond that includes a spacer layer.

In FIG. 7, The sensor includes a spacer layer 303 bonded between the first and second layers 302, 304 along surfaces 354 and 356, respectively. The spacer layer 303 provides the thickness to form at least part of the cavity 308. The arrangement shown in FIG. 7 has the advantage that the thickness of the cavity 308, in other words the spacing between substantially flat layers 302, 304 can be easily adjusted by selecting a spacer layer with the desired thickness.

As the flat or low profile layer of grain growth metal is heated, it experiences grain growth, thereby changing shape and growing in a direction transverse to the surface of the contact pad. A grain growth material is selected for the sensor such that the grain growth material grows at a temperature which does not melt or otherwise damage the assembled sensor. The material is preferably a metal, metal alloy, non-metallic electrically conductive material, or other material which provides grain growth including polysilicon. Deposits of tantalum which can include small quantities of other elements are also contemplated, provided the deposit can be grown.

The electrically conductive grain growth material can be tantalum or a tantalum alloy. In the case of tantalum, it is believed the growth occurs because tantalum grows grains or crystals which project outwardly from the contact pad. After sufficient growth has occurred, a bridge of tantalum is formed between the contact pads, forming an ohmic interconnection of tantalum between the contact pads. If the cavity spacing is too wide, the gap can be kept small enough to be completed by growth of the electrically conductive grain growth material by the use of one or more opposite mesas (see FIGS. 10 and 11) extending into the cavity. (Mesa refers to a feature that is raised from a surface and may have a flat top surface.) At least part of the electrically conductive grain growth material is deposited on one layer or mesa. Electrically conductive grain growth material can be deposited on one or both layers, with or without use of mesas, depending on the gap in the cavity. After the layers have been assembled, and the bond between the layers has been at least partially formed, the pressure sensor is heated to effect growth of the electrically conductive grain growth material to form the interconnection.

The sensor is cooled, and there is then a solid metal, ohmic contact inside the sensor channel which has been formed after assembly and bonding of the sensor substrates. This delayed electrical interconnection process avoids undesired mechanical contact which could otherwise interfere with the close contact of the substrates when the substrates are directly bonded to one another.

Figure 8:
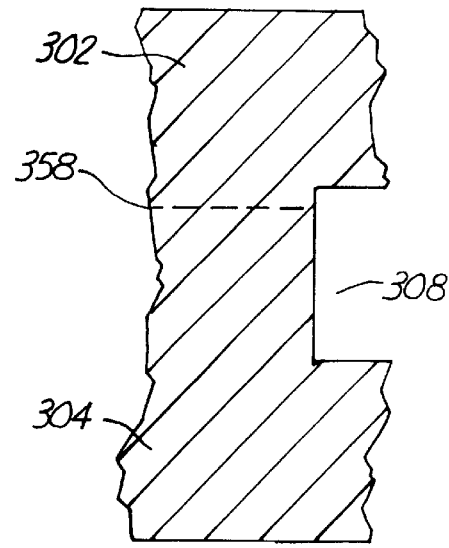
FIG. 8 shows a cross-sectional view of an embodiment of a bond between layers formed with different recess depths.

In FIG. 8, a recess is formed in each of layers 302, 304, however the recesses have different depths. The layers join along a surface 358 that is offset from the centerline of cavity 308. The arrangement shown in FIG, 8 has the advantage that fine adjustments to the cavity depth can be made by adjusting etching of the recess in layer 302, while the recess in layer 304 can be etched to a standard desired depth.

FIGS. 9–12 illustrate example arrangements for providing the needed quantity of grain growth material and for providing the needed spacing for the growth of grains to bridge the gap.

Figure 9:
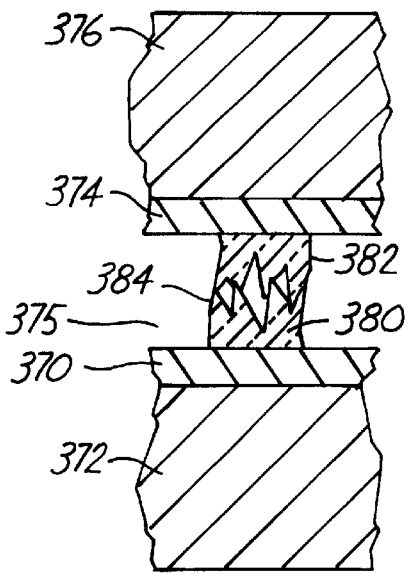
FIG. 9 shows an embodiment of a grain growth interconnect in which grain growth material is deposited on two facing interconnect regions.

In FIG. 9, a first conductive film 370 is deposited on a first layer 372, and a second conductive film 374 is deposited on a second layer 376. First conductive film 370 faces second conductive film 374 across a cavity 375. A first deposit 380 of grain growth material is deposited on first conductive film 370. A second deposit 382 of grain growth material is deposited on the second conductive film 374. When the layers 372, 376 are bonded to one another, the deposits 380, 382 do not mechanically contact one another. After the layers 372, 376 are bonded together, then conditions are applied to cause the grain growth material deposits 380, 382 to grow grains which make mechanical connection and ohmic contact and complete an electrical interconnect 384.

Figure 10:
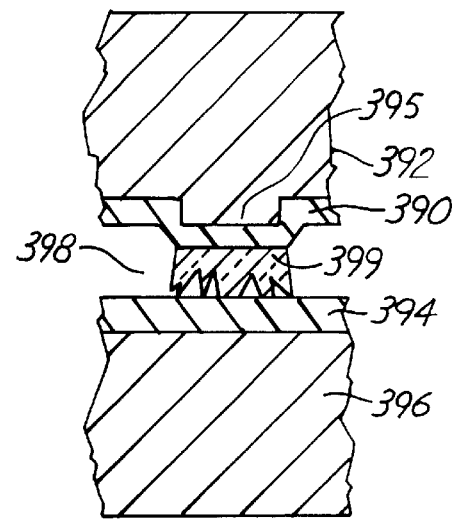
FIG. 10 shows an embodiment of a grain growth interconnect in which grain growth material is deposited on one of two facing interconnect regions and a mesa is aligned with the interconnect regions.

In FIG. 10, a first conductive film 390 is deposited on a first layer 392, and a second conductive film 394 is deposited on a second layer 396. First conductive film 390 faces second conductive film 394 across a cavity 398. The first layer 392 includes a mesa 395 that is aligned with the first conductive film 390. The mesa 395 causes the first conductive film 390 to protrude into the cavity 398, reducing the gap between conductive films 390, 394. A deposit 399 of grain growth material is deposited on first conductive film 390. When the layers 392, 396 are bonded to one another, the deposit 399 does not mechanically contact the conductive film 394. After the layers 392, 396 are bonded together, then conditions are applied to cause the grain growth material deposit 399 to grow grains which make mechanical connection and ohmic contact and complete an electrical interconnect between conductive films 390, 394.

Figure 11:
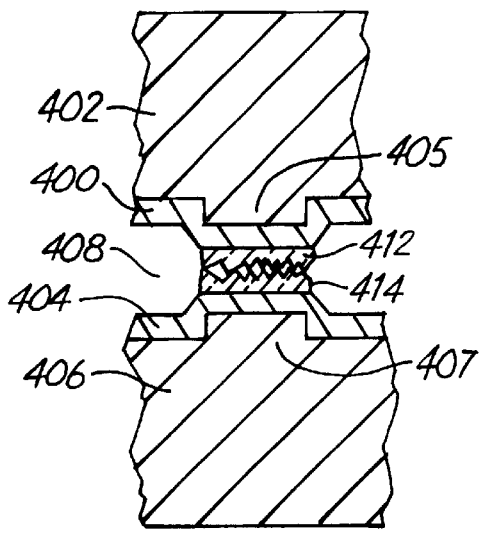
FIG. 11 shows an embodiment of a grain growth interconnect in which grain growth material is deposited on two facing interconnect regions and two mesas are aligned with the interconnect regions.

In FIG. 11, a first conductive film 400 is deposited on a first layer 402, and a second conductive film 404 is deposited on a second layer 406. First conductive film 400 faces second conductive film 404 across a cavity 408. The first layer 402 includes a mesa 405 over part of first conductive film 400. The mesa 405 causes the first interconnect region 405 to protrude into the cavity 408, reducing the gap between conductive films 400, 404. The second layer 406 also includes a mesa 407 over second conductive film 404. A first deposit 412 of grain growth material is deposited on first conductive film 400. A second deposit 414 of grain growth material is deposited on the second conductive film 404. When the layers 402, 406 are bonded to one another, the deposits 412, 414 do not mechanically contact one another. After the layers 402, 406 are bonded are bonded together, then conditions are applied to cause the grain growth material deposits 412, 414 to grow grains which make mechanical connection and ohmic contact and complete an electrical interconnect between conductive films 400, 404.

Figure 12:
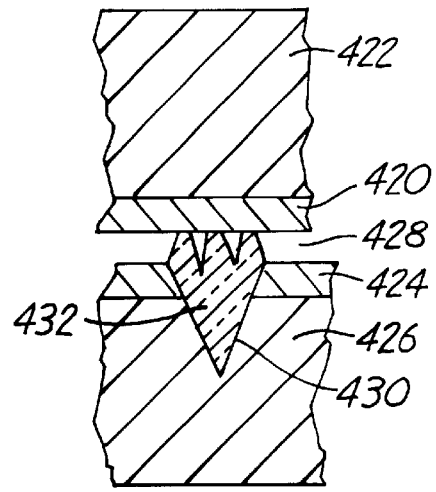
FIG. 12 shows an embodiment of a grain growth interconnect in which a supply of growth material is provided in a depression in a layer

In FIG. 12, a first conductive film 420 is deposited on a first layer 422, and a second conductive film 424 is deposited on a second layer 426. First conductive film 420 faces second conductive film 424 across a cavity 428. The second conductive film 424 surrounds a depression 430 in the layer 426. A first deposit 432 of grain growth material is deposited in the depression. When the layers 422, 426 are bonded to one another, the deposit 432 does not mechanically contact the first conductive film 420. After the layers 422, 426 are bonded together, then conditions are applied to cause the grain growth material deposit 432 to grow grains which make mechanical connection and ohmic contact and complete an electrical interconnect between conductive films 420, 424. The second conductive film 424 can be open over the depression 430 as shown, or can alternatively be deposited on the walls of the depression 430. An additional volume of grain growth material deposit 432 is supplied in the depression 430 which increases the size of grains that can be grown and the size of the gap that can be bridged using grain growth material.

FIGS. 13–16 illustrate various bonds that can be made at 306 between layers 302, 304 in FIG. 3.

Figure 13:
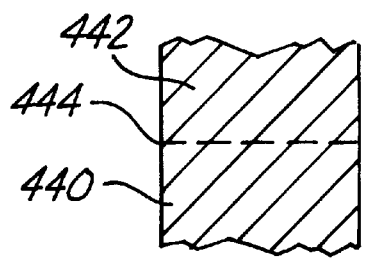
FIG. 13 shows an embodiment of a bond between layers of similar material without any intervening bonding material.

In FIG. 13, a first layer 440 is bonded to a second layer 442 of the same or similar material along a surface 444, without the use of any bonding material. The bond at surface 444 can be a fusion bond, or it can be a direct or contact bond using mirror polished surfaces. These bonds can be made with materials such as sapphire, spinel, corundum, silica glass, silicon and other brittle insulating materials using known bonding methods.

Figure 14:
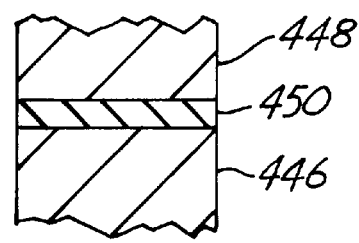
FIG. 14 shows an embodiment of a reaction bond between layers of similar material.

In FIG. 14, a first layer 446 is bonded to a second layer 448 using an intermediate bonding layer 450 to provide a reaction bond. Layer 450 can be of any bonding material, however, the layers 446, 448 can be made of alumina ceramic and the bonding layer 450 can be formed of platinum. This may require the use of an intermediary adhesive layer on layers 446 and 448.

Figure 15:
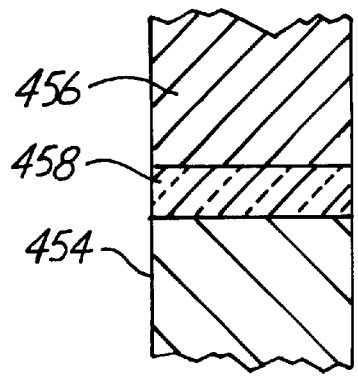
FIG. 15 shows an embodiment of a thin film or a sintered solder bond.

In FIG. 15, a first layer 454 is bonded to a second layer 456 using an intermediate bonding layer 458. Layers 454, 456 can be formed of single crystal sapphire and the intermediate bonding layer 458 can be a thin film solder or sintered bond between the layers 454, 456.

Figure 16:
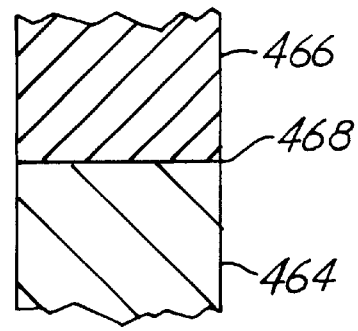
FIG. 16 shows an embodiment of an anodic bond.

In FIG. 16, a first layer 464 is bonded to a second layer 466 using an anodic bond 468. Layer 464 is preferably formed of borosilicate glass ("Pyrex") and layer 466 is preferably formed of silicon.

The alternatives illustrated in FIGS. 5–16 can be combined with one another as needed to meet the needs of a particular sensor application. The sensing element 318 illustrated schematically in FIG. 3 can be a pressure sensing element. The grown interconnect structure is particularly useful with capacitive pressure sensing elements where there are capacitive electrodes on both facing sides of the cavity. The sensing element 318 can also comprise a temperature sensor element such as a platinum resistance thermometer, an optical sensor element such as a photodiode, a radiation sensor element such as a microwave antenna element or ionization sensor element, a magnetic sensor element such as a Hall effect device or other known sensor elements.

FIG. 17–18 shows front and side views, respectively, of an embodiment of a capacitive pressure sensor 480. Internal features of sensor 480 are illustrated in FIG. 17 with dashed and dotted lines. Sensor 480 includes a first layer 482 and a second layer 484 that are bonded together to form an internal cavity 485 (shown in FIG. 19) between the layers. A first electrically conducting film 486 is deposited on the first layer 482, and a second electrically conductive film 488 is deposited on the second layer 484. The first and second electrically conducting films 486, 488 have corresponding first and second interconnect regions 490, 492 facing one another across the cavity 485.

A first portion 494 of a capacitive pressure sensor element is deposited in the cavity 485 on the first layer 482 and is electrically coupled to the first electrically conductive film 486. The portion 494 of the capacitive pressure sensor element is formed of the same material as the electrically conductive film 486. A second portion 498 of the capacitive pressure sensor element is deposited in the cavity 485 on the second layer 484 and is electrically coupled to the second electrically conductive film 488. The second portion 498 is also formed of the same material as the electrically conductive film 488. The first and second portions 494, 498 of the capacitive pressure sensor element comprise capacitive electrodes or plates that are spaced apart and face one another across the cavity 485. When pressure is applied to the outer surfaces of the sensor 480, one or both of the layers 482, 484 deflect to move the plates and change a spacing or gap between the electrodes or plates, and thus change the electrical capacitance at between the electrodes as a function of pressure.

An electrically conductive grain growth material 496 is selectively deposited on at least one of the interconnect regions 490, 492 and grown upon predetermined conditions to form an electrical interconnect between the first and second interconnect regions 490, 492.

Electrically conductive film 486 includes bonding pad portions 500, 502 that are externally exposed so that leads or wires can be bonded to them for connecting the sensor to an electrical sensing circuit.

The cavity 485 is evacuated and then sealed by glass frit 504 to provide a pressure sensor that is an absolute pressure sensor. Feedthrough leads formed in the layer 486 extend from inside the cavity 485 to the electrical contact pads 500, 502 on an external surface of the capacitive pressure sensor 480. The electrical interconnect at 490, 492, 496 connects the first capacitor electrode 498 to a feedthrough lead and contact pad 500

The sensor 480 has an elongated shape extending from a first end including the first and second capacitive electrodes 494, 498 to a second end including the feedthrough leads. The body of sensor 480 includes a central region between the first and second ends adapted for mounting the sensor through a wall (not illustrated). Pressurized fluid is applied to the first end, and electrical connections can be made at the second end. The wall separates the pressurized fluid from the electrical connections.

Figure 19:
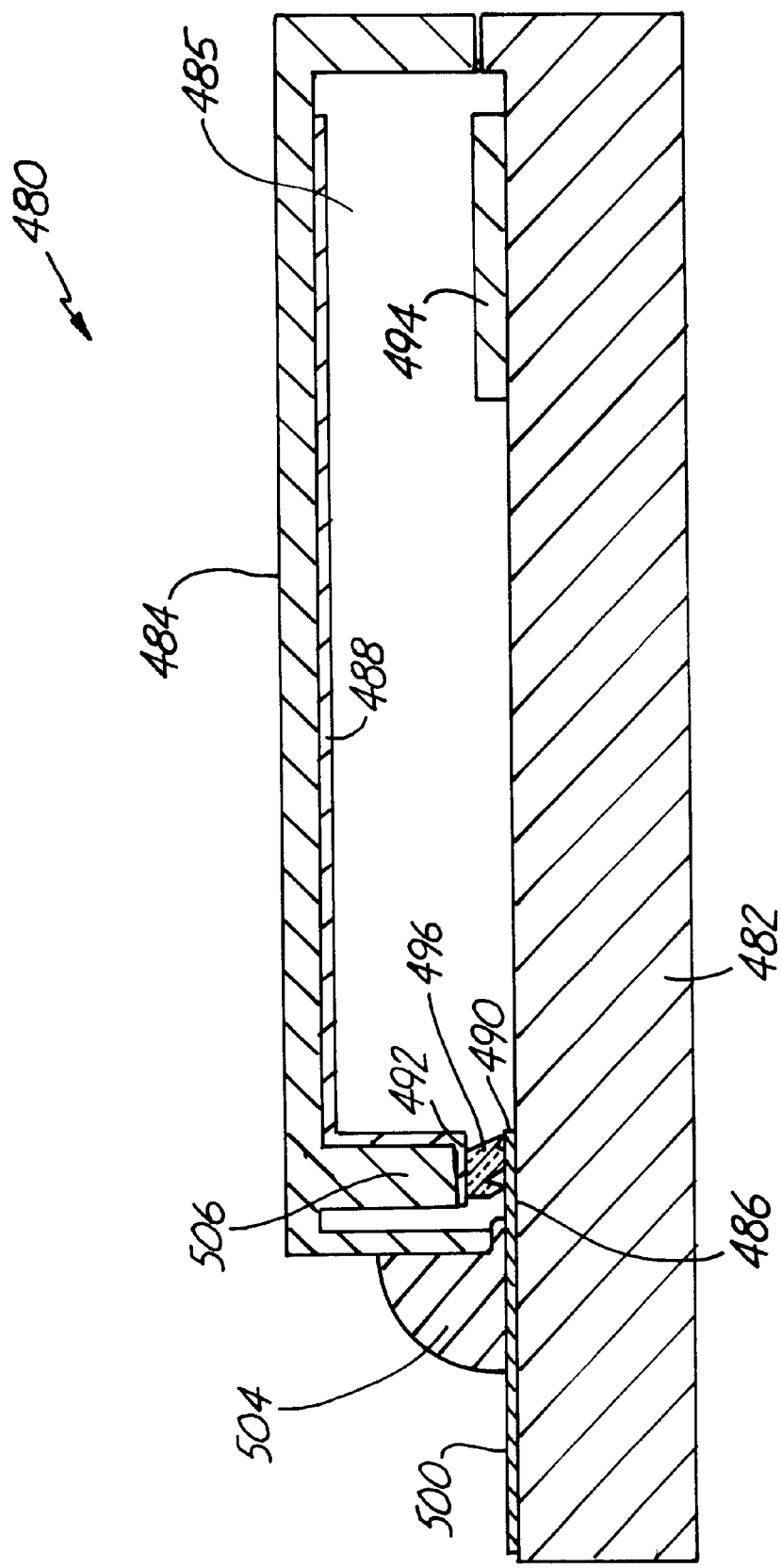
FIG. 19 shows a cross-sectional view of the sensor in FIG. 17 taken along line 19—19 in FIG. 17.

FIG. 19 illustrates a cross-sectional view of the capacitive pressure sensor 480 along line 19-19 in FIG. 17. In FIG. 19, the horizontal scale has been distorted to better illustrate the features of the capacitive pressure sensor 480. As can be seen in FIG. 19, the interconnect region 492 is deposited on a mesa 506, reducing the gap to be bridged by grain growth material.

Figure 20:
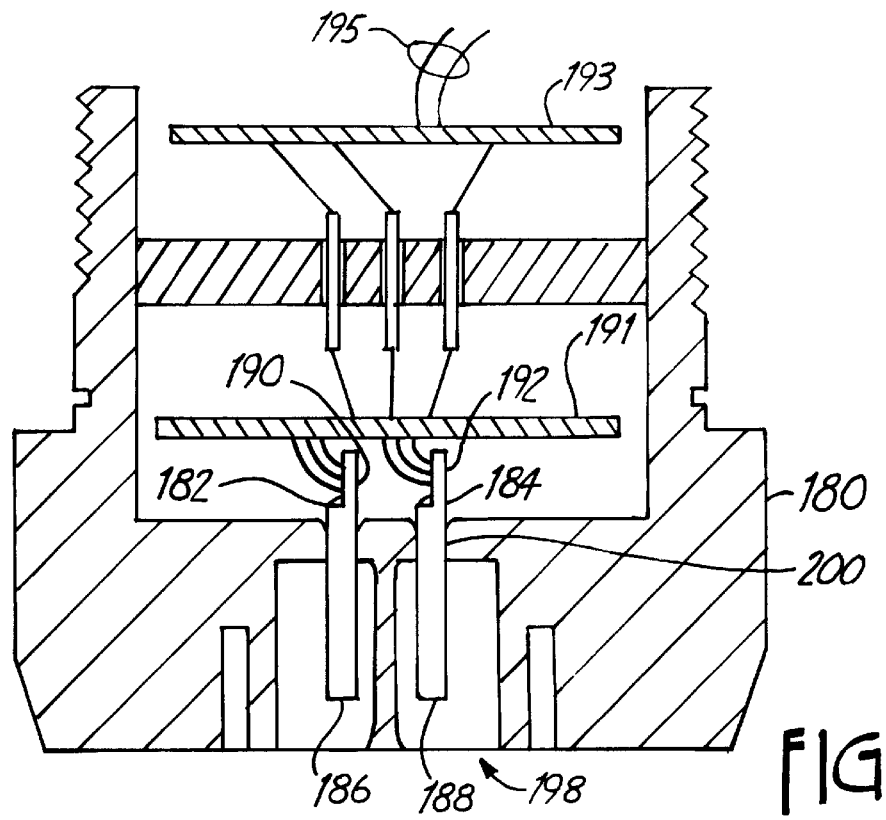
FIG. 20 shows a pressure sensor module for a pressure transmitter.

In FIG. 20, a pressure sensing module 180 for use in pressure transmitter 36 of shown in FIG. 2. Assembly 180 includes two MEMS sensors 182, 184. Sensors 182, 184 each have a beam integrally formed of alumina around a central channel or cavity having sensing films on facing layers interconnected by a deposit formed substantially of tantalum. In sensors 182, 184, a sensing film is in the channel adjacent the blind end, the sensing film has an electrical parameter that varies with pressure, and electrical leads extending from the channel and out the gap. A seal fills the gap around the leads. An isolation cup 198 has an opening 200 sealed to an outer surface of the beam between the blind end and the opposite, isolated end. Sensors 182 and 184 are shown connected to a measurement circuit board 191 which provides an electrical output to transmitter circuit board 193 which is related to applied pressure. Transmitter circuit 193 can be configured to couple to a two-wire process control loop 195. Example loops 195 include loops in accordance with the HART® or Fieldbus standards. In some embodiments, circuitry 193 and 191 can be completely powered with power form loop 195.

Figure 21:
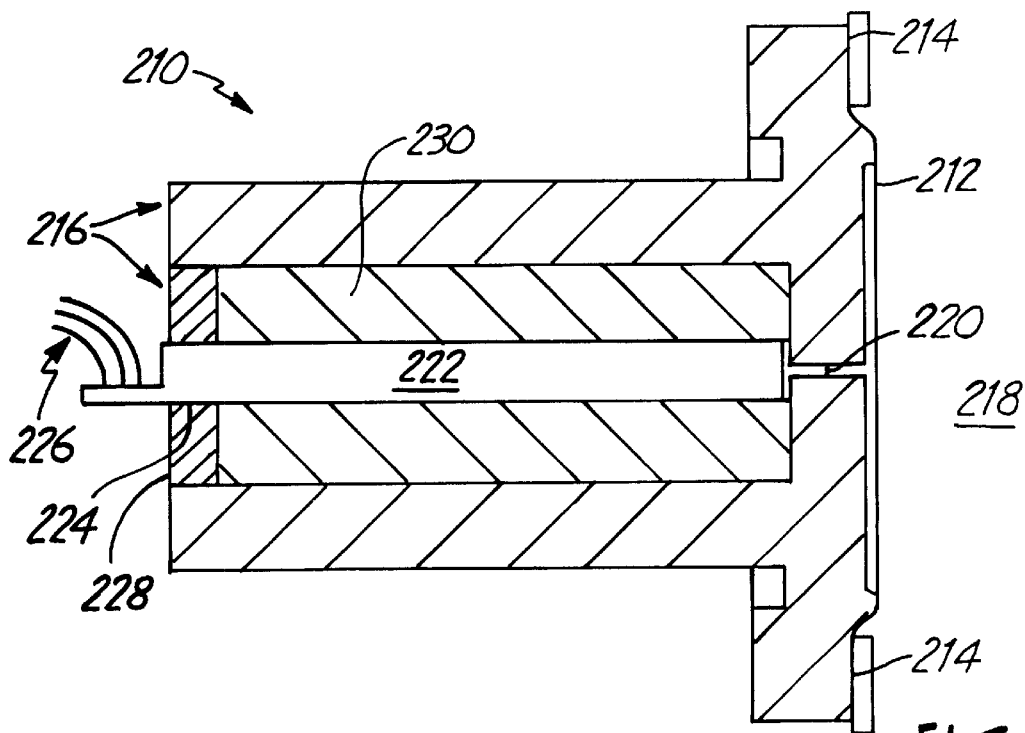
FIG. 21 shows a cross-sectional view of a pressure sensor module for a pressure transmitter.

In FIG. 21, a sensing module 210 is shown that includes an isolator diaphragm 212 with a rim 214 sealed to an isolator cup 216 Isolator diaphragm 212 separates process fluid 218 from isolator fluid 220 that is sealed in the space enclosed by the isolator cup 216 and the isolator diaphragm. Sensor 222 is constructed as discussed above and is sealed to an opening 224 in the isolator cup 216. The isolator diaphragm 212 and isolator fluid 220 couple pressure to the sensor 222 while isolating the sensor from the process fluid 218. Isolator cup 216 has sensor 222 passing through sealed opening 224 and isolates electrical connections 226 on the sensor 222 from both the pressurized process fluid 218 and the pressurized isolator fluid 220, which is typically silicone oil. The isolator cup can include a back plate 228 which has a temperature coefficient of expansion closely matched to the temperature coefficient of expansion of the sensor 222. A block of material 230 can be pressed in the isolator cup 216 and the material 230 has a temperature coefficient of expansion which partially compensates for the temperature coefficient of expansion of the isolator fluid 220 to limit undesired movement of isolator diaphragm 212 due to temperature changes. A small gap filled with isolator fluid 220 is provided between block 230 and sensor 222.

Although the present invention has been described with reference to preferred embodiments, workers skilled in the art will recognize that changes may be made in form and detail without departing from the scope of the invention. For example, sensor leads may feedthrough multiple channels instead of a single channel. In the case where multiple channels are used, the frit used to seal the gap may be replaced with a conductive solder or braze seal for multiple gaps. Interconnections can also be grown transversely to interconnect leads on facing side surfaces of mesas or rims in the cavity. Anodic bonds can also be used with some materials in place of direct bonds. With both anodic and direct bonding techniques, intermediate bonding materials between layers can be avoided with these methods. The term "contact bond" as used in this application includes both a direct bond and an anodic bond. Electrically conductive grain growth material can include tantalum and other metals, and also polysilicon, conductive nitride ceramics, conductive metal oxides, silicides and poly II-IV compounds. The term "grain growth" is known in the art and relates to a growth process driven by surface energy of the grain boundaries. Example explanations of grain growth are provided in pages 251–269 of the book entitled "Physical Metallurgy Principles" dated Oct. 26, 1993 and pages 448–461 of the book entitle "Introduction to Ceramics" dated Jan. 9, 1990 which are incorporated herein by reference.

What is claimed is:

1. A microelectromechanical system (MEMS) sensor, comprising:
    first and second layers that are bonded together and form a cavity between the layers;
    first and second electrically conducting films deposited on the first and second layers, the first and second electrically conducting films having first and second interconnect regions facing one another across the cavity;
    a sensor element deposited in the cavity and electrically coupled to the first electrically conductive film; and
    an electrically conductive grain growth material selectively deposited on at least one of the interconnect regions, and grown upon predetermined conditions to form an electrical interconnect between the first and second interconnect regions.

2. The sensor of claim 1 wherein the first layer includes a first recess that forms at least part of the cavity.

3. The sensor of claim 2 wherein the second layer includes a second recess that forms at least part of the cavity.

4. The sensor of claim 1 wherein the electrically conductive grain growth material comprises tantalum.

5. The sensor of claim 1 further comprising a spacer layer bonded between the first and second layers and forming at least part of the cavity.

6. The sensor of claim 1 wherein the electrically conductive grain growth material is deposited on one of the first and second interconnect regions.

7. The sensor of claim 1 wherein the electrically conductive grain growth material is deposited on both the first and the second interconnect regions.

8. The sensor of claim 1 wherein at least one of the first and second layers includes a mesa aligned with one of the first and second interconnect regions.

9. The sensor of claim 1 wherein at least one of the first and second layers includes a depression aligned with one of the first and second interconnect regions, wherein a supply of the grain growth material is deposited in the depression.

10. The sensor of claim 1 wherein the first and second layers are bonded together by contact bonding.

11. The sensor of claim 1 wherein the first and second layers are bonded together by direct bonding.

12. The sensor of claim 1 wherein the first and second layers are bonded together by fusion bonding.

13. The sensor of claim 1 wherein the first and second layers are bonded together by reaction bonding.

14. The sensor of claim 1 wherein the first and second layers are bonded together by a sintered bond solder.

15. The sensor of claim 1 wherein the first and second layers are bonded together with anodic bonding.

16. The sensor of claim 1 wherein the sensor element includes a pressure sensor element.

17. The sensor of claim 16 wherein the pressure sensor comprises a capacitive pressure sensor element.

18. The sensor of claim 17 including the capacitive pressure sensor element being formed of the same material as the electrically conductive film.

19. The sensor of claim 18 wherein the capacitive pressure sensor element comprises a first capacitor electrode deposited on the first layer and a second capacitor electrode deposited on the second layer, the first and second capacitor electrodes being spaced apart across the cavity from one another and adapted to sense deflection between the first and second layers.

20. The sensor of claim 19 wherein one of the first and second electrically conductive films includes feedthrough leads that extends from inside the cavity to electrical contact pads on an external surface of the capacitive pressure sensor.

21. The sensor of claim 20 wherein the electrical interconnect connects the first capacitor electrode to a feedthrough lead on the second layer.

22. The sensor of claim 21 wherein the sensor has an elongated shape extending from a first end including the first and second capacitive electrodes to a second end including the feedthrough lead.

23. The sensor of claim 22 wherein the sensor body includes a central region between the first and second ends adapted for mounting the sensor.

24. The sensor of claim 23 wherein the cavity extends into the central region and the cavity in the central region has a narrower width than width of the cavity in the first end.

25. The sensor of claim 23 wherein the cavity extends into the central region and the cavity in the central region includes a support mesa extending between the first and second layers.

26. The sensor of claim 21 further comprising a feedthrough seal formed over the leads between the cavity and the electrical contact pads.

27. The sensor of claim 18 further including a temperature sensor element deposited in the cavity.

28. The sensor of claim 18 wherein the first and second layers are bonded together by contact bonding and the sensor is heated to improve the contact bond between the first and second layers.

29. The sensor of claim 1 wherein the first and second layers are formed substantially of a material selected from the group: alumina, silicon, quartz, spinel, glass, crystalline ceramic.

30. The sensor of claim 1 wherein the first and second layers are each formed of single crystal alumina.

31. A pressure transmitter, comprising a MEMS sensor according to claim 1.

32. The pressure transmitter of claim 31 further comprising an process fluid isolator coupling pressure to the MEMS sensor.

33. The sensor of claim 1 wherein the grown growth material comprises a metal.

34. The sensor of claim 1 wherein the grown growth material comprises a metal alloy.

35. A pressure sensor, comprising:
    first and second layers bonded together by contact bond to form a pressure sensor body having a cavity formed between the first and second layers;
    electrically conducting film selectively deposited in the cavity to sense deflection of the sensor body due to pressure; and
    electrically conductive grain growth material grown to form an electrical interconnection.

36. A pressure sensor, comprising:
    a sensor body assembled from at least first and second layers joined together with a contact bond, the sensor body forming a cavity between facing surfaces of the first and second layers;
    a sensor element sensing deflection of the sensor body, the sensor element comprising electrically conducting film selectively deposited on one of the facing surfaces;

a lead deposited on the other of the facing surfaces, which lead is adapted to extend from the cavity; and means for interconnecting the sensing electrically conducting film and the lead including a electrically conductive grain growth material deposit placed on at least one of the electrically conducting film and the lead that upon predetermined condition grows to form an interconnection between the sensing electrically conducting film and the lead.

37. A microelectromechanical system (MEMS), comprising:

a body assembled from at least first and second layers joined together, the body forming a cavity between facing surfaces of the first and second layers;

a first electrical conductor deposited on one of the facing surfaces;

a second electrical conductor deposited on the other of the facing surfaces; and an electrically conductive grain growth material deposit placed on at least one of the conductors that upon predetermined condition grows grains to form an interconnection between the conductors.

38. The device of claim 37 wherein the body further includes a mesa extending into the cavity and at least part of the electrically conductive grain growth material is deposited on the mesa.

39. The device of claim 38 wherein a first portion of the electrically conductive grain growth material is deposited on the first layer and a second portion of the electrically conductive grain growth material is deposited on the second layer opposite the first portion.

40. The device of claim 37 wherein the device is heated to effect growth of the electrically conductive grain growth material to form the interconnection.

41. The device of claim 37 wherein the body is formed substantially of a material selected from the group consisting of alumina, silicon, quartz, spinel, glass, and crystalline ceramic.

42. The device of claim 37 wherein the first and second layers are each formed of single crystal alumina.

* * * * *

UNITED STATES PATENT AND TRADEMARK OFFICE
CERTIFICATE OF CORRECTION

PATENT NO. : 6,516,671 B2
DATED : February 11, 2003
INVENTOR(S) : Mark G. Romo et al.

It is certified that error appears in the above-identified patent and that said Letters Patent is hereby corrected as shown below:

Title page,
Item [56], References Cited, U.S. PATENT DOCUMENTS, insert
-- 4,628,403    12/1986    Kuisma . . . . . . . . 361/283 --
OTHER PUBLICATIONS, insert --
U.S. patent application Ser. No. 09/477,689, Sittler, filed January 6, 2000.
U.S. patent application Ser. No. 09/478,383 Lutz et al., filed January 6, 2000.
U.S. patent application Ser. No. 09/478,434, Frick et al., filed January 6, 2000.
U.S. patent application Ser. No. 09/603,640, Sittler et al., filed January 6, 2000. --

Signed and Sealed this

Twenty-third Day of March, 2004

JON W. DUDAS
*Acting Director of the United States Patent and Trademark Office*